United States Patent [19]

Ferrier et al.

[11] Patent Number: 4,748,104

[45] Date of Patent: May 31, 1988

[54] SELECTIVE METALLIZATION PROCESS AND ADDITIVE METHOD FOR MANUFACTURED PRINTED CIRCUIT BOARDS

[75] Inventors: Donald R. Ferrier, Thomaston; Gary B. Larson, Cheshire, both of Conn.

[73] Assignee: MacDermid, Incorporated, Waterbury, Conn.

[21] Appl. No.: 929,595

[22] Filed: Nov. 10, 1986

[51] Int. Cl.$^4$ ................................................. G03C 5/00
[52] U.S. Cl. ..................................... 430/315; 430/319; 430/329; 427/98
[58] Field of Search ............... 430/313, 314, 315, 319, 430/325, 326, 329; 427/97, 98; 106/1.24, 287.12, 287.13, 287.16, 287.15

[56] References Cited

U.S. PATENT DOCUMENTS 4,668,532  5/1987  Moisan et al. ..................... 427/97

Primary Examiner—John E. Kittle
Assistant Examiner—Jose G. Dees
Attorney, Agent, or Firm—St. Onge Steward Johnston & Reens

[57] ABSTRACT

A process for selective metallization of a substrate in a predetermined desired pattern, and particularly for the manufacture of printed circuit boards, in which a substrate patterned in desired manner with resist material is treated with conditioning agent, adjuvant and deactivating agent preparatory to catalytic activation and electroless deposit of metal flash. By proceeding in this manner, adherent flash metal deposit is achieved on non-resist areas without encountering significant plating on resist areas. Following metal flash deposit, the resist can be easily and cleanly stripped and additional metal then built up on the flash metal.

18 Claims, No Drawings

SELECTIVE METALLIZATION PROCESS AND ADDITIVE METHOD FOR MANUFACTURED PRINTED CIRCUIT BOARDS

BACKGROUND OF THE INVENTION

The present invention relates to a selective metallization process, particularly to the manufacture of printed circuit boards and, more particularly, to an improved manufacturing sequence for producing printed circuits having thru-holes requiring metallization. The invention also relates to a composition for use in this manufacturing sequence.

Selective metallization processes, whereby metal is provided on a substrate in a predetermined aesthetic and/or functional pattern, are well known and have particular commercial application in the manufacture of printed circuit boards.

In the manufacture of printed circuit boards, it is now commonplace to produce printed circuitry on both sides of a planar rigid or flexible insulating substrate. Of increased importance is the manufacture of multilayer printed circuits. In these products, the board consists of parallel, planar, alternating innerlayers of insulating substrate material and conductive metal. The exposed outer sides of the laminated structure are provided with circuit patterns as with double-sided boards, and the metal innerlayers may themselves contain circuit patterns.

In double-sided and multilayer printed circuit boards, it is necessary to provide conductive interconnection between or among the various layers or sides of the board containing conductive circuitry. This is commonly achieved by providing metallized, conductive thru-holes in the board communicating with the sides and layers requiring electrical interconnection. Typically, thru-holes are drilled or punched through the board structure at desired locations. The thus exposed hole surfaces, consisting partly or entirely of insulating material, are then metallized, generally by utilization of electroless metal depositing techniques.

In terms of providing the desired circuit pattern on the board, the art has developed a variety of manufacturing sequences, many of which fall into the broad categories of "subtractive" or "additive" techniques. Common to subtractive processes is the need to etch away (or subtract) metal to expose substrate surface in areas where no circuitry is desired. Accordingly, some disadvantages associated with subtractive processes include the necessity of using relatively large quantities of etching solutions, possible undesired undercutting of metal in areas where metal is supposed to remain, and waste of base metal (or need for processes to reclaim base metal).

Additive processes, on the other hand, begin with exposed substrate surfaces and build up thereon metallization in desired areas, the desired areas being those not masked by a previously-applied pattern of plating resist material (e.g., photoresist in negative pattern). While avoiding the problems associated with the etching required in subtractive processes, additive processes are not without their own inherent difficulties in terms of the choice of resist materials and the ability to build up to the full metallization desired by electroless methods.

In one additive technique known in the art, the insulating substrate surfaces are first sensitized and activated to form a blanket catalyzed layer thereon. Next, the appropriate resist pattern is formed over the catalyzed layer so as to leave exposed the areas where metallization is desired. Thereafter, the substrate is treated in an electroless metal depositing solution to effect metallization only of the catalyzed and exposed desired areas. In this process, however, it is necessary after removal of the resist to etch away the catalytic layer which was under the resist so as to prevent excessively low surface resistivity between metallized areas on the substrate due to the catalytic layer.

In another proposed technique, a negative pattern of resist is first applied to the substrate surfaces. The entire surface (including the resist surfaces) is then sensitized and activated, followed by treatment of the entire surface with an electroless metal depositing solution, resulting in deposit of metal on all surfaces. The resist is then stripped from the substrate surface, carrying along with it the metal deposited thereon, and thus leaving behind the build up metallized pattern. In this process, however, the deposition of metal over the resist is quite substantial and leads to difficulties in cleanly stripping the resist, often resulting in the remaining metallized areas adjacent the resist (e.g. conductors) having ragged edges or slivers, correspondingly poor fine line resolution or definition, and risk of shorting.

U.S. Pat. No. 4,388,351 to Sawyer sought to improve upon the foregoing by depositing over all surfaces (including resist surfaces) only a thin flash layer of electroless metal, followed by stripping of the resist and electroless build up to full desired metallization on the patterned flash surfaces remaining. The Sawyer technique, applicable to use with photoresists of the type which require hydrocarbon solvents for development and stripping, was extended by Dorey, II, et al. in U.S. Pat. No. 4,574,031 so as to have applicability to photoresists of the type which can be developed and stipped in aqueous alkaline solutions.

In processes of the Sawyer and Dorey, II, et al. type, the degree or extent of flash plating must be controlled within relatively narrow limits. On the one hand, sufficient thickness is required in order for the flash plate to serve its intended purpose as a defined base upon which further metallization can be built up in the required pattern after resist removal. However, if the flash deposit is too thick, stripping of the resist is quite difficult and may lead to the existence of ragged edges or metal slivers or whiskers in flash plated areas adjacent to where the resist existed. In practice, it has proven to be quite difficult to strike a proper balance within the narrow confines of the process. Particular difficulty also is found with respect to thru-hole coverage. In those cases where the flash plate is sufficiently thin so as not to interfere with resist removal, thru-hole coverage by metal is poor; but when the process is arranged so as to provide better thru-hole coverage, the increased thickness of the layer plated on the resist interferes with resist removal.

SUMMARY OF THE INVENTION

As a consequence of the foregoing difficulties, it is a specific object of the invention to provide an additive process of the type described for the manufacture of printed circuit boards which permits adequate thru-hole metal coverage while at the same time permitting resist stripping to be cleanly and efficiently effected.

Another object of the invention is to provide an additive process for the manufacture of printed circuit boards which attains good thru-hole metal coverage and fine-line definition in and among the circuit patterns.

Yet another object of the invention is to provide a composition for use in additive processes of the type described which enables the manufacture of printed circuit boards having good thru-hole metal coverage and fine-line circuit pattern definition.

A more general object of the invention is to provide a selective metallization process for providing a predetermined pattern of metal on a substrate surface.

These and other objects are attained according to the present invention by means of a manufacturing sequence in which an insulating substrate is provided with a resist or mask in a negative pattern so as to define, at those areas not covered by resist, the areas where metallization is desired; thereafter contacting the substrate with conditioning, adjuvant and deactivating materials functional to increase the adsorptivity of the surfaces not covered by resist to subsequently-applied species catalytic to electroless metal deposition, while rendering resist surfaces less receptive to electroless metal deposition; thereafter contacting the substrate with solutions which result in deposit of species catalytic to electroless metal deposition on those areas receptive thereto; thereafter contacting the conditioned and catalyzed substrate with an electroless metal depositing solution to deposit a thin flash layer of metal on surfaces of the substrate not protected by resist; thereafter stripping the resist from the substrate; and thereafter plating additional metal over the previously-applied thin flash layer of metal.

As noted, the process of the invention has particular applicability to the manufacture of printed circuit boards containing metallized thru-holes, and most of the description which follows is directed specifically to this embodiment for ease of discussion, with the understanding that more general functionality in selective metallization processes is readily apparent.

In accordance with the present invention, the essential approach of Sawyer and Dorey, II, et al. is followed in terms of application of resist on the substrate, activation/catalyzation, electroless flash plate, resist removal and further build up of metal on flash-plated areas. In the inventive process, however, there is interposed, prior to the activation step, conditioning, adjuvant and deactivating steps which have the result of rendering exposed substrate areas (including thru-hole surfaces) more receptive to the subsequently-applied catalyst and, hence, to the subsequently-applied electroless flash plate. At the same time, however, the resist surfaces are rendered less receptive to acceptance of catalyst and flash plate. As can be easily appreciated, proceeding in this manner achieves good thru-hole metallization (as well as good metallization of other exposed substrate areas) without the concomitant undesirable deposition on the resist of a flash plate which is of sufficient thickness or continuity to prevent clean stripping of the resist.

In the preferred practice of the invention the interposed treatment is divided into two sequential steps, the first of which utilizes conditioning materials effective to increase receptivity of thru-hole and other substrate surfaces to catalyst and flash plate, and the second of which utilizes deactivating materials effective to decrease the receptivity of resist surfaces to catalyst and flash plate.

In terms of essential function, the process of the invention requires utilization in the interposed sequence of a material most accurately described as a conditioning agent, as such term is known and used in the art. This agent may be chosen from among the wide variety of compounds with which the art is familiar for rendering insulating substrate surfaces more receptive to adsorption of catalyst used to promote electroless metal deposition. As known in the art, the particular material chosen will be dependent upon the composition of the insulating substrate being treated and will be employed at concentrations and at conditions specifically chosen for effectiveness in the particular system. Among the suitable such conditioning agents are cationic wetting or film-forming agents, organosilanes and the like, with the most preferred such agents being organosilanes.

Also required in the interposed sequence is a material which possesses the capability of acting as a solvent of sorts for the particular resist material employed, although the extent of treatment therewith is ineffective actually to dissolve away the resist to any substantial degree. Rather, the material, denominated here a deactivating agent, appears to function in a manner not entirely understood to either smooth the resist surface or otherwise render it less receptive to subsequently-applied catalyst and flash plate. Of necessity, this deactivating agent will be chosen and employed so as to be functional with the particular resist material in question. In the preferred practice of the invention, employing resists which are developable and strippable in aqueous alkaline solutions, the deactivating agent can be a dilute solution of alkaline water-soluble material such as sodium carbonate or sodium hydroxide.

Finally, it has been found necessary to include yet another material in the interposed sequence, termed herein an adjuvant, in order to obtain the desired results of the inventive process. The adjuvant preferably is an amine compound, more preferably a compound having two or more amine groups, and most preferably is selected from ethylenediamine, 1,2-propanediamine, N,N,N',N'-tetramethyl-1,3-butanediamine, diethylene triamine, and mixtures thereof, although other non-amine compounds also are believed suitable. The specific functionality of the adjuvant is not clearly understood, but it appears to act in concert with the other materials to render the resist less receptive to plating.

In the preferred practice of the invention, the interposed sequence will involve a first contact of the substrate with a solution combining the conditioning agent and adjuvant, followed (preferably after water rinsing) with contact of the substrate with the deactivating agent.

DETAILED DESCRIPTION OF THE INVENTION

Generally, the process of the present invention involves an initial step of application of a resist composition to a substrate suitable for manufacture of a printed circuit board.

Suitable substrates for use in the present invention include any rigid or flexible insulating organic or inorganic material such as resins, glass, ceramics and the like. For manufacture of printed circuits, typical substrate materials are insulating thermosetting resins, thermoplastic resins, and mixtures thereof, including fiber, e.g., fiberglass, impregnated variations of the foregoing.

Included in the thermoplastic resins are acetyl resins; acrylics, such as methacrylate; cellulosic resins, such as ethyl cellulose, cellulose acetate, cellulose propionate, cellulose acetate butyrate, cellulose nitrate, and the like;

polyethers; nylon; polyethylene; polystyrene; styrene blends, such as acrylonitrile-styrene copolymers and acrylonitrile-butadiene styrene copolymers; polycarbonates; polychlorotrifluoroethylene; and vinyl polymers and copolymers, such as vinyl acetate, vinyl alcohol, vinyl butyral, vinyl chloride, vinyl chloride acetate copolymer, vinylidene chloride and vinyl formal.

Among the thermosetting resins may be mentioned allyl phthalate; furane; melamine formaldehyde; phenol formaldehyde; and phenol furfural copolymers, alone or compounded with butadiene acrylonitrile copolymers or acrylonitrile-butadiene styrene copolymers; polyacrylic esters; silicones; urea formaldehyde; epoxy resins; allyl resins; glycerol phthalates; polyesters; and the like.

The substrates may also comprise porous materials and fibers which have been impregnated with resins. The invention is particularly applicable to metallization of resin-impregnated fiber structures and varnish coated resin-impregnated fiber structures of the type described. A preferred and typical substrate is glass reinforced epoxy substrate commercially available as NEMA grade FR-4. Polyimide type substrates are also suitable.

After a substrate has been selected, thru-holes are drilled therein and, as usually is necessary or prudent, the substrate is cleaned in preparation for further processing.

In the next step in the process, a resist is applied to the substrate in a predetermined pattern defining, in those areas not covered by resist, the eventual desired metal circuitry pattern. The resist may, if desired, consist simply of a suitable organic resin or ink applied to the substrate through a screen in the desired pattern. Far more preferable, however, is the use of photoresists, i.e., radiation-sensitive compositions which can be imaged or exposed through a suitably patterned mask and then developed. The photoresist composition may be of the negative or positive acting type, may be further of the liquid or dry film type, and may be further of the solvent or aqueous developable and strippable type. For the preferred liquid type resists, uniform application of the photoresist to the substrate is obtained by spraying, roller coating, coating through a screen or other like processes, followed by imaging and development.

Among the preferred photoresists are those which can be developed in aqueous alkaline medium and eventually stripped in aqueous alkaline medium, whether of the liquid type (e.g., Accutrac TM photoresists #2314 and #2491 available from W. R. Grace) or of the dry film type (e.g., Riston 3600, available from E. I. duPont de Nemours & Co.). Photoresists of the solvent developable/strippable type are less preferred due to environmental concerns for the solvents employed, but include those of the RISTON series of photoresists available from E. I. duPont deNemours & Co.

Generally, the substrate masked with photoresist will then be treated with swelling and etching solutions to form micropores therein which aid in achieving good adherence of eventual metal deposit to the substrate surface. Typically, for the commonly employed epoxy-glass substrates (commercially known as FR-4 panels), with or without further rubber modified epoxy coatings thereon, the sellant will be a dimethylformamide solution heated somewhat above room temperature. After water rinsing, the substrate can be treated with, e.g., a chromic acid/sulfuric acid etching solution, rinsed again, and treated with a solution to remove chromium ions or reduce them to the +3 valence state, as for example by use of sodium metabisulfite or hydrazine. When resists which are aqueous alkaline strippable are employed, care must be taken to insure that any aqueous solutions employed after resist application (e.g., such as a sodium metabisulfite solution to remove or reduce chromium ions) be of a pH sufficiently low (e.g., pH 10 or less) so as not to dissolve or strip the resist material.

The resist patterned substrate is next treated in accordance with the present invention with conditioner, adjuvant and deactivator prior to catalysis and electroless metal plating.

As previously noted, the conditioner may be selected from any of the known agents employed in the art for promoting adsorption of the catalyst for electroless metal deposition onto a substrate surface, particularly thru-hole surfaces. As is known in the art, conditioners function as bridges between the substrate surface and the catalyst materials, most often by formation of an adherent layer or film over the exposed substrate surfaces, which film exhibits better adsorptive attraction for the catalyst than does the substrate surface. Although originally developed for use with glass-filed epoxy substrates to improve otherwise poor catalyst adsorption and consequent poor metal coverage (believed to be due to the existence of negative surface charge on exposed glass fibers in conjunction with the negative charge carried by typically-employed palladium/tin catalyst particles), conditioners are not commonly employed with a wide variety of substrate materials, whether glass-containing or not. Typically the conditioner or conditioning agent is a cationic film-forming compound, such as methyl bis(2-hydroxyethyl) octadecyl ammonium chloride, but other suitable bridging compounds may be employed of the film-forming or non-film-forming type so long as improved adsorption is obtained between substrate surface and catalyst particles. Particularly preferred are the organo-functional silanes such as the vinylsilanes (e.g., vinyltrichlorosilane, vinyltriethoxysilane, vinyltrimethoxysilane, vinyltris-(beta-methoxyethoxy)silane, vinyltriacetoxysilane); aminoalkylsilanes (e.g., gamma-aminopropyltriethoxysilane, gamma-aminopropyltrimethoxysilane, N-beta-(Aminoethyl)-gamma-aminopropyltrimethoxysilane, N'-(beta-aminoethyl)-N-(beta-aminoethyl)-gamma-aminopropyltrimethoxysilane); ureidoalkyl silane esters (e.g., gamma-ureidoalkyltriethoxysilane); epoxyalkylsilanes (e.g., beta-(3,4-epoxycyclohexyl)-ethyltrimethoxysilane, gamma-glycidoxypropyltrimethoxysilane); and methacryloxysilane esters (gamma-methacryloxypropyltrimethoxy silane, gamma-methacryloxypropyl-tris-(betamethoxyethoxy) silane. Contact of substrate with conditioning agent generally will be via immersion in a solution of the conditioning agent, with the concentration of conditioning agent being from about 0.1 to 8 g/l, particulary 0.5 to 8 g/l for the organosilanes.

Preferably with, but alternatively before or after, contact of the substrate with conditioning agent, the resist-patterned substrate also is contacted with an adjuvant compound. The precise functionality of the adjuvant is not particularly well understood and may in some way assist in the conditioning of the substrate surfaces for adsorption of catalyst and receipt of electroless metal deposit. However, its essential functionality appears to reside in somehow affecting the plateability of the resist surfaces, rendering them less receptive to adsorption of catalyst and/or receipt of metal deposit, when utilized in conjunction with the later-discussed deactivating material. This effect is significant since it eliminates the problems encountered with the prior art processes described earlier in which the electroless metal deposit, even though a thin flash plate, can deposit so tenaciously to the resist as to either make the resist difficult to remove per se or leave behind metal silvers when removed. At the same time, however, excellent thru-hole coverage is obtained.

In general, the functional adjuvants will preferably be amine compounds, most preferably compounds having two or more amine groups, and particularly compounds such as ethylenediamine, 1,2-propanediamine, N,N,N',N'-tetramethyl-1,3-butanediamine, diethylene diamine and mixtures thereof. As noted earlier, the adjuvant may conveniently be combined with the conditioning agent in solution for an economical one-step immersion of resist-patterned substrate therein, but may alternatively be utilized in a separate step (before or after) the conditioning step. Typically, the concentration of adjuvant per se in any solution thereof in which the resist-patterned substrate is immersed will be on the order of about 5–15 g/l, preferably about 10 g/l.

Following the treatment of the resist-patterned substrate with conditioning agent and adjuvant, it is next subjected to treatment with a deactivating agent which technically comprises a solvent for the resist material but which is employed in a concentration and for a time insufficient to actually effect any substantial dissolution, and particularly no stripping or loosening, of the resist. Functionally, the deactivating agent renders the resist surfaces less receptive to the catalytic materials and metal deposit employed in subsequent steps. For the preferred resist employed in the invention, i.e., photoresists which are developable and strippable in aqueous alkaline media, the deactivating agent will comprise a dilute aqueous alkaline solution of, e.g., sodium carbonate, sodium hydroxide or the like. For photoresists requiring organic solvents for development and stripping, the deactivating agent will comprise an appropriate compatible organic solvent. In all cases, the contact time between resist-patterned substrate and deactivating agent will be chosen to be sufficiently short so as to avoid dissolution of the resist but long enough to effect the smoothing or other mechanism responsible for making the resist less receptive to catalyst adsorption and metal deposit.

Following these treatments with conditioning agent, adjuvant and deactivating agent, the resist-patterned substrate is treated with a solution which deposits species catalytic to electroless depostion, or precursors of such species, on the substrate surfaces. As noted, the treatments preceding this catalysis or activation are designed to promote catalyst adsorption on exposed substrate areas (i.e., those not covered by resist), while minimizing or eliminating adsorption of catalyst on resist surfaces. Typically, the activating solution will be of the one-step type, as described for example, in U.S. Pat. Nos. 3,011,920 and 3,532,518, involving true or colloidal sols or solutions of palladium and tin compounds. This activation process usually is followed by an acceleration step which functions either to remove excess tin deposits or alter the valence of the tin compounds or other mechanism to stabilize the catalyst on the substrate surface and insure its exposure in the subsequent electroless plating step. Where an acceleration step is employed, particularly preferred is the use of an oxidizing accelerator as described in U.S. Pat. No. 4,608,275 to Kukanskis, et al. One-step catalysts also are known which do not require acceleration, such as the organic acid-containing compositions described in Canadian Pat. No. 1,199,754 of Rhodenizer.

The activated resist-patterned substrate is then immersed in an electroless metal depositing bath to apply a thin flash layer of metal to the suitably activated areas, generally on the order of 0.01 to 0.1 mil in thickness. By reason of the preparatory treatments, only minimal if any metal deposition occurs on the resist surfaces while areas not covered by resist receive an adherent metal flash. The flash metal deposited in this manner typically will consist of copper or nickel, and a wide variety of commercially-available baths for electroless deposition of such metals exist such as those aqueous baths based upon formaldehyde or hypophosphite reducing agents. The particular bath chosen must, under the operating conditions employed, be compatible with (i.e., not degrade or dissolve) the particular resist material present on the substrate. For example, formaldehyde or hypophosphite based depositing baths which operate in the range above about pH 10, while useful for metallizing substrates patterned with organic solvent-strippable resists, cannot be employed if the resist is one which is strippable in aqueous alkaline media since premature resist stripping will thus occur during the plating process. Accordingly, when aqueous alkaline strippable resists are employed, suitable electroless baths must be those operable at pH below about 10. Fortunately, suitable hypophosphite copper and nickel baths operative below pH 10 exist, such as described in U.S. Pat. Nos. 4,209,331 and 4,279,948. A particularly preferred bath is the hypophosphite-reduced copper bath available from MacDermid, Inc. of Waterbury, Connecticut under designation 249-T.

Following metallization, the resist materials is stripped utilizing any appropriate stripping medium therefor, either in a single step or series of steps. For the preferred aqueous alkaline strippable resists for use herein, stripping can be achieved using any suitable aqueous alkaline solution such as based upon sodium hydroxide.

Stripping of the resist from the substrate results in a substrate now patterned with thin metal flash, also present in thru-holes where applicable. Upon this flash metal can be built up further thickness of similar or dissimilar metal until the desired thickness of metal is attained. Typically this full build will be accomplished using appropriate electroless plating baths (now without concern for compatability with resist material), although electroplating techniques can be employed if conductive continuity exists or is arranged.

In the process of the invention, then, selective metallization of substrate surfaces is achieved in a straightforward and economical manner, unattended by the problems existing in prior art processes. As particularly applied to manufacture of double-sided or multi-layer printed circuit boards having thru-holes, the process provides a means for achieving the proper balance between sufficient metallization of thru-holes and minimized plating over resist surfaces so as to permit easy resist stripping and eliminate the possibility of leaving behind, after stripping, metal slivers which could result in shorting and/or which result in need for further processing.

The invention is described in additional detail in the following examples of particular embodiments.

EXAMPLE I

To an epoxy-glass substrate board having thru-holes drilled therein is uniformly applied a coating of a liquid, aqueous alkaline developable and aqueous alkaline strippable photoresist composition of the negative type (W. R. Grace #3000). The coated substrate is then exposed to light through a suitably patterned mask, developed in aqueous alkaline medium to dissolve away unexposed portions and then dried and post-cured to arrive at a resist-patterned substrate. The substrate is then treated in a dimethylformamide solution to swell the surfaces, rinsed, and treated with a chromic acid/sulfuric acid etching solution to form micropores on the surfaces. The board is then rinsed with water and treated with a combined acid neutralizer/glass etchant (MacDermid 9278/9279) to improve catalyst and metal adhesion to the glass filling fibers and again rinsed.

At this stage in the process, the resist-patterned board is treated with an aqueous solution containing, as conditioner, 0.5% N-beta-(aminoethyl)-gamma-aminopropyl-trimethoxysilane and as adjuvant, 1% ethylenediamine, the treatment being at 75° F. for five (5) minutes. Following a cold water rinse, the board is treated with an aqueous solution containing 50 g/l sodium carbonate to deactivate the resist surfaces. After water rinsing, the board is treated with an acid pre-dip for one minute (MacDermid 9008), and then catalyzed using a one-step palladium/tin catalyst solution prepared according to U.S. Pat. No. 3,532,518 (Mactivate 10, MacDermid, Inc.). The board is rinsed in cold water and the catalyst accelerated by immersion of the board in an alkaline oxidizing accelerator bath according to U.S. Pat. No. 4,608,275 containing sodium chlorite. Following a warm water rinse, the board is immersed in a hypophosphite-reduced electroless copper bath (MacDermid 249-T) to deposit a flash layer of copper about 0.02 mils thick on the catalyzed, exposed substrate areas (including thru-hole surfaces), with very minimal plating occurring on the resist surfaces. The board is rinsed and the resist stripped by sequenced treatment with 3N sodium hydroxide, water rinse and 1N sodium hydroxide. The stipping proceeded easily and cleanly. The board is rinsed, baked for one hour at 150° C. to drive off any residual dimenthylformamide and then treated with an electroless copper depositing bath to achieve full build of copper over the flash coated areas.

EXAMPLE II

The process of Example I is repeated with similar results using as the conditioner/adjuvant an aqueous solution containing 0.5% gamma-aminopropyltriethoxysilane and 1% ethylenediamine, at room temperature for five minutes.

EXAMPLE III

The process of Example I is repeated with similar results using as the conditioner/adjuvant an aqueous solution containing 0.1 g/l methylbis(hydroxyethyl)octadecyl ammonium chloride and 1% ethylenediamine, at room temperature for five minutes.

EXAMPLE IV

The process of Example I is repeated with similar results using as the conditioner/adjuvant an aqueous solution containing 0.1% MacDermid Preactivator 9420 and 2% ethylenediamine, at room temperature for five minutes.

EXAMPLE V

Example I is repeated with similar results using as the deactivating agent 2N sodium hydroxide.

In variations upon the foregoing example processes, elimination of the adjuvant and deactivating agent resulted in extensive flash plating over the resist. The same was true for elimination only of the adjuvant, as well as elimination only of the deactivating agent. Elimination of the conditioning agent results in poor thruhole metal coverage.

EXAMPLE VI

The process of Example I is repeated a number of times with similar results, varying only the adjuvant employed. In one run N,N,N',N'-tetramethyl-1,3-butanediamine was used, and in another, triethylene tetraamine was employed.

What is claimed is:

1. A process for metallizing a substrate in a preselected pattern, comprising the steps of:
    (a) applying a resist to the substrate surface in a predetermined pattern such that the exposed substrate areas not covered by the resist define the desired substrate pattern to be metallized;
    (b) thereafter treating the resist-patterned substrate with a conditioning agent effective to increase adsorption of subsequently-applied catalytic species to exposed substrate areas;
    (c) treating the resist-patterned substrate with an adjuvant material effective to decrease the receptivity of resist surfaces to subsequently-applied catalytic species and flash metal deposit;
    (d) thereafter treating the resist-patterned substrate with a deactivating agent comprising a solvent for said resist, the conditions of said treatment being such as to decrease the receptivity of resist surfaces to subsequently-applied catalytic species and flash metal deposit without effecting any substantial dissolution of said resist;
    (e) thereafter providing on the resist-patterned substrate species catalytic to electroless flash deposition of metal;
    (f) thereafter immersing the resist-patterned substrate in an electroless metal depositing bath to provide on the exposed, catalyzed areas of said substrate a thin flash metal deposit;
    (g) thereafter stripping the resist from the substrate, leaving a flash metal deposit on the substrate in the preselected desired pattern; and
    (h) thereafter providing additional metal on the pattern of flash metal deposit.

2. The process according to claim 1 wherein said application of resist in a predetermined pattern comprises the steps of (i) uniformly coating the substrate surface with a photoresist composition which is developable in aqueous alkaline medium and, after development, strippable in aqueous alkaline medium, (ii) imaging said photoresist composition by exposing it to light through a suitably patterned mask; and (iii) developing said imaged photoresist utilizing aqueous alkaline developing medium so as to remove undesired resist from predetermined areas on said substrate surface and leave behind on said surface a desired predetermined pattern of resist.

3. The process according to claim 2 wherein said adjuvant is an amine.

4. The process according to claim 3 wherein said adjuvant is selected from the group consisting of ethylenediamine, 1,2-propanediamine, N,N,N',N'-tetramethyl-1,3-butanediamine, diethylene triamine, and mixtures thereof.

5. The process according to claim 2 wherein said deactivating agent comprises an aqueous alkaline solution.

6. The process according to claim 2 wherein said conditioning agent comprises an organosilane.

7. The process according to claim 2 wherein said electroless metal depositing bath comprises a formaldehyde-free, hypophosphite-reduced electroless copper bath having an operating pH below about 10.

8. The process according to claim 1 wherein said treating with conditioning agent and adjuvant is effected in a single step.

9. A process for manufacturing by additive processes a printed circuit board having metallized thru-holes, comprising the steps of:
    (a) applying a resist to a thru-hole containing printed circuit board substrate surface in a pre-determined pattern such that the thru-holes remain exposed and the exposed substrate surfaces not covered by the resist define the desired circuit pattern;
    (b) thereafter treating the resist-patterned substrate with a conditioning agent effective to increase adsorption of subsequently-applied catalytic species to exposed substrate surfaces including thru-hole surfaces;
    (c) treating the resist-patterned substrate with an adjuvant material effective to decrease the receptivity of resist surfaces to subsequently-applied catalytic species and flash metal deposit;
    (d) thereafter treating the resist-patterned substrate with a deactivating agent comprising a solvent for said resist, the conditions of said treatment being such as to decrease the receptivity of resist surfaces to subsequently-applied catalytic species and flash metal deposit without effecting any substantial dissolution of said resist;
    (e) thereafter providing on the surfaces of resist-patterned substrate, including thru-hole surfaces, species catalytic to electroless flash deposition of metal;
    (f) thereafter immersing the resist-patterned substrate in an electroless metal depositing bath to provide on the exposed, catalyzed areas of said substrate, including thru-hole surfaces, an adherent thin flash metal deposit;
    (g) thereafter stripping the resist from the substrate, leaving a flash metal deposit on the substrate in the preselected desired circuit pattern and on the thru-hole surfaces; and
    (h) thereafter providing additional metal on the areas of flash metal deposit.

10. The process according to claim 9 wherein said application of resist in a predetermined pattern comprises the steps of (i) coating the substrate with a photoresist composition which is developable in aqueous alkaline medium and, after development, strippable in aqueous alkaline medium; (ii) imaging said photoresist composition by exposing it to light through a suitably patterned mask; and (iii) developing said imaged photoresist utilizing aqueous alkaline developing medium so as to remove undesired resist from predetermined areas on said substrate surface and leave behind on said surface a desired predetermined pattern of resist.

11. The process according to claim 10 wherein said adjuvant is an amine.

12. The process according to claim 11 wherein said adjuvant is selected from the group consisting of ethylenediamine, 1,2-propanediamine, N,N,N',N'-tetramethyl-1,3-butanediamine, diethylene triamine, and mixtures thereof.

13. The process according to claim 10 wherein said deactivating agent comprises an aqueous alkaline solution.

14. The process according to claim 10 wherein said conditioning agent comprises an organosilane.

15. The process according to claim 10 wherein said electroless metal depositing bath comprises a formaldehyde-free, hypophosphite-reduced electroless copper bath having an operating pH below about 10.

16. The process according to claim 9 wherein said treating with conditioning agent and adjuvant is effected in a single step.

17. A process for manufacturing a printed circuit board containing metallized thru-holes by an additive process, comprising the steps of:
    (a) applying to a thru-hole-containing printed circuit board substrate a photoresist composition which is developable in aqueous alkaline medium and, after development, is strippable in aqueous alkaline medium;
    (b) imaging said photoresist composition through a mask in a desired pattern;
    (c) developing said imaged photoresist composition utilizing aqueous alkaline medium so as to result in a printed circuit board substrate having exposed thru-hole surfaces and having resist in a predetermined pattern on the substrate surface such that the exposed substrate surfaces not covered by said resist define the desired circuit pattern;
    (d) thereafter treating the resist-patterned substrate with a conditioning agent effective to increase adsorption of subsequently-applied catalytic species to exposed substrate surfaces, including thru-hole surfaces;
    (e) treating the resist-patterned substrate with an adjuvant material selected from the group consisting of ethylenediamine, 1,2-propanediamine, N,N,N',N'-tetramethyl-1,3-butanediamine, diethylene triamine, and mixtures thereof;
    (f) treating the resist-patterned substrate with a deactivating agent comprising an aqueous alkaline medium under conditions insufficient to effect any substantial dissolution of said resist;
    (g) thereafter providing on the surfaces of the resist-patterned substrate, including thru-hole surfaces, species catalytic to electroless flash deposition of metal;
    (h) thereafter immersing the resist-patterned substrate in an electroless copper depositing bath of a pH of 10 or less to provide on the exposed, catalyzed areas of said substrate, including thru-hole surfaces, a thin, adherent copper flash deposit;
    (i) thereafter stripping the resist from the substrate using aqueous alkaline medium, leaving a flash metal deposit on the substrate in the desired circuit pattern and on the thru-hole surfaces; and
    (j) thereafter depositing additional copper metal on the areas of flash copper deposit.

18. The process according to claim 17 wherein said treating with conditioning agent and adjuvant is effected in a single step.

* * * * *

UNITED STATES PATENT AND TRADEMARK OFFICE
CERTIFICATE OF CORRECTION

PATENT NO. : 4,748,104
DATED : May 31, 1988
INVENTOR(S) : Donald R. Ferrier and Gary B. Larson It is certified that error appears in the above-identified patent and that said Letters Patent are hereby corrected as shown below:

Column 5, line 63, "sellant" should read -- swellant --

Column 6, line 28, "not" should read -- now --

Column 8, line 36, "materials" should read -- material --

Signed and Sealed this

Sixth Day of September, 1988

Attest:

DONALD J. QUIGG

Attesting Officer  Commissioner of Patents and Trademarks